(12) United States Patent
Arayama et al.

(10) Patent No.: US 6,434,728 B1
(45) Date of Patent: Aug. 13, 2002

(54) ACTIVATION PATH SIMULATION EQUIPMENT AND ACTIVATION PATH SIMULATION METHOD

(75) Inventors: Masashi Arayama; Eiji Furuta, both of Yokohama; Tadashi Konno, Kawasaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/527,296

(22) Filed: Mar. 17, 2000

(30) Foreign Application Priority Data

Sep. 2, 1999 (JP) .......................... 11-248430

(51) Int. Cl.[7] .............................. G06F 17/50
(52) U.S. Cl. ............................... 716/6; 716/4
(58) Field of Search .................. 716/1, 2, 4, 5–6, 716/12, 7–10, 18

(56) References Cited

U.S. PATENT DOCUMENTS 5,920,489 A * 7/1999 Dibrino et al. ............... 716/2
5,966,521 A * 10/1999 Takeuchi et al. ............. 716/6
6,223,333 B1 * 4/2001 Kuribayashi et al. ........ 716/12

* cited by examiner

*Primary Examiner*—Matthew Smith
*Assistant Examiner*—Paul Dinh
(74) *Attorney, Agent, or Firm*—Armstrong, Westerman & Hattori, LLP

(57) ABSTRACT

An activation path simulation equipment and an activation path simulation method in accordance with the present invention divides a transistor circuit into a plurality of blocks with reference to pn junction nodes of the transistors included therein, and activation patterns are determined for each block using the characteristics of each transistor so as to efficiently create activation patterns of the transistor circuit. In this way, the number of activation patterns to be created can be decreased without creating unnecessary activation patterns, therefore the number of times of simulation can be decreased, which means that simulation speed increases.

15 Claims, 11 Drawing Sheets

FIG. 1A

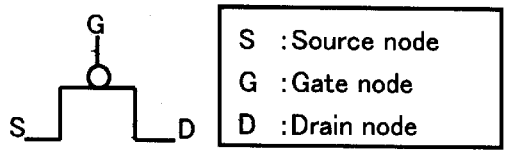

S : Source node
G : Gate node
D : Drain node

FIG. 1B  Definition table of operation rule of p-type transistor

| Drain value | Source value | | | | | |
|---|---|---|---|---|---|---|
| | | 0 | 1 | X | Z | W0 | W1 |
| Gate value | 0 | W0 | 1 | X | Z | W0 | W1 |
| | 1 | Z | Z | Z | Z | Z | Z |
| | X | X | X | X | X | X | X |
| | Z | X | X | X | X | X | X |
| | W0 | W0 | 1 | X | Z | W0 | W1 |
| | W1 | Z | Z | Z | Z | Z | Z |

※Definition of value
X : Undefined value
W1 : Weak 1
W0 : Weak 0

FIG. 2A

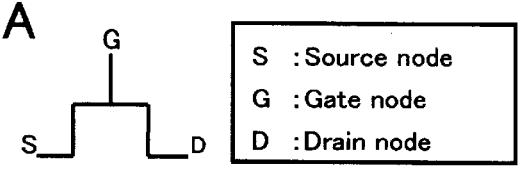

S : Source node
G : Gate node
D : Drain node

FIG. 2B  Definition table of operation rule of n-type transistor

| Drain value | Source value | | | | | |
|---|---|---|---|---|---|---|
| | | 0 | 1 | X | Z | W0 | W1 |
| Gate value | 0 | Z | Z | Z | Z | Z | Z |
| | 1 | 0 | W1 | X | Z | W0 | W1 |
| | X | X | X | X | X | X | X |
| | Z | X | X | X | X | X | X |
| | W0 | Z | Z | Z | Z | Z | Z |
| | W1 | 0 | W0 | X | Z | W0 | W1 |

※Definition of value
X : Undefined value
W1 : Weak 1
W0 : Weak 0

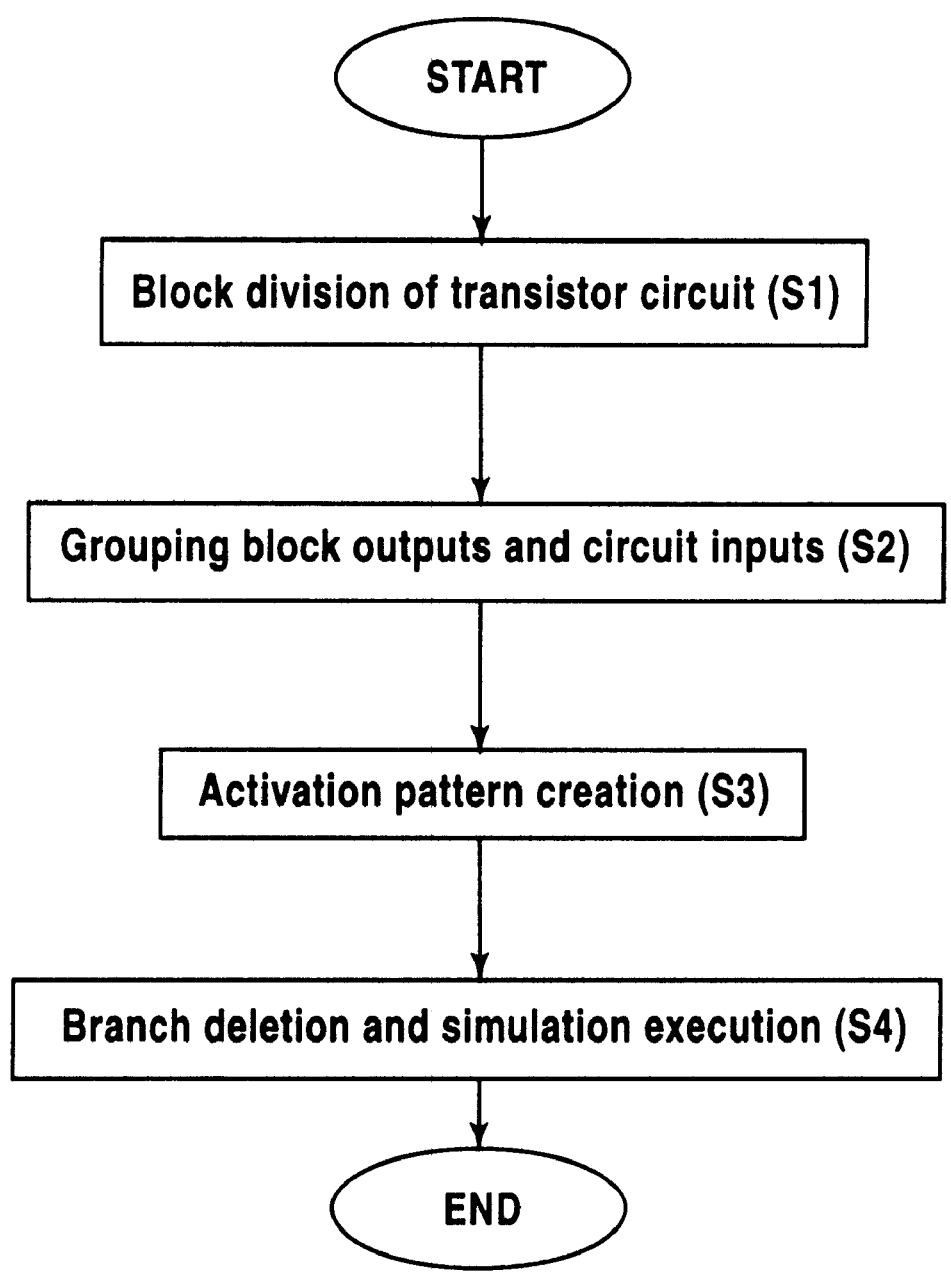

——: IN1→OUT1 activation

Grouping of circuit input in case of activation of IN1→OUT1 in Fig. 8

| Block output | Grouped circuit input |
|---|---|
| b1_out : | IN1,IN2 |
| b2_out : | IN3 |
| OUT1 : | IN4 |

FIG.12A
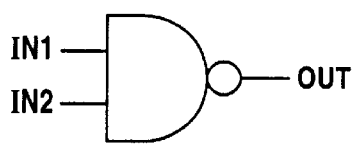
FIG.12B
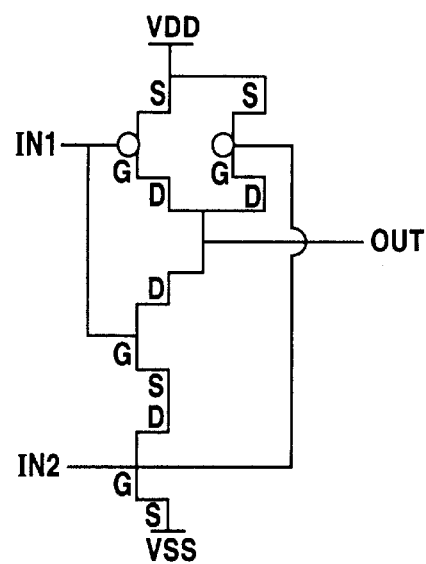
FIG.12C
| IN1 | IN2 | OUT |
|-----|-----|-----|
| 0 | 0 | 1 |
| 1 | 0 | 1 |
| 0 | 1 | 1 |
| 1 | 1 | 0 |
} OUT not change by IN1's change
} OUT changes by IN1's change
FIG.12D
| IN1 | IN2 | OUT |
|-----|-----|-----|
| α | 1 | α |

Activation pattern of BLK1~BLK3
in case of activation IN1→OUT1

| Block | Pin | | | | Pattern | | | |
|---|---|---|---|---|---|---|---|---|
| BLK1 | IN1 | IN2 | b1_out | | $\alpha$ | 0 | $\alpha$ | |
| BLK2 | b1_out | IN3 | b2_out | | $\alpha$ | 0 | $\alpha$ | |
| | | | | | $\alpha$ | 1 | $\alpha$ | |
| BLK3 | b2_out | IN3 | IN4 | OUT1 | $\alpha$ | 1 | 0 | $\alpha$ |
| | | | | | $\alpha$ | 1 | 1 | $\alpha$ |

FIG. 14

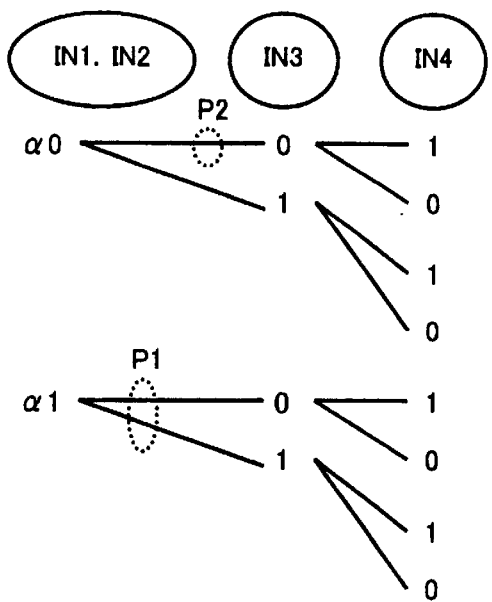

FIG. 15A

Simulation rule of pn junction node (excluding dot node of path transistor)

| Node value | Node value | | | | | | 
|---|---|---|---|---|---|---|
| | | 0 | 1 | X | Z | W0 | W1 |
| Node value | 0 | 0 | X | X | 0 | 0 | X |
| | 1 | X | 1 | X | 1 | X | 1 |
| | X | X | X | X | X | X | X |
| | Z | 0 | 1 | X | Z | W0 | W1 |
| | W0 | 0 | X | X | W0 | W0 | X |
| | W1 | X | 1 | X | W1 | X | W1 |

※Definition of value
X: Undefined value
W1: Weak 1
W0: Weak 0

FIG. 15B

Simulation rule of dot node of path transistor

| Node value | Node value | | | | | | 
|---|---|---|---|---|---|---|
| | | 0 | 1 | X | Z | W0 | W1 |
| Node value | 0 | X | X | X | 0 | 0 | X |
| | 1 | X | X | X | 1 | X | 1 |
| | X | X | X | X | X | X | X |
| | Z | 0 | 1 | X | Z | W0 | W1 |
| | W0 | 0 | X | X | W0 | W0 | X |
| | W1 | X | 1 | X | W1 | X | W1 |

※Definition of value
X: Undefined value
W1: Weak 1
W0: Weak 0

ACTIVATION PATH SIMULATION EQUIPMENT AND ACTIVATION PATH SIMULATION METHOD

BACKGROUND OF THE INVENTION

1. Field of the Invention

The present invention relates to an activation path simulation equipment and activation path simulation method.

2. Description of the Related Art

Path delay analysis simulation for transistor circuits in designing transistor circuits is now executed for activation patterns at gate level. To determine a critical path by simulation, the activation patterns of a transistor circuit must be obtained.

When all the activation patterns of a path (activation path) from an arbitrary input to output are determined, for example, and if an activation signal is input to an input on the activation path in the transistor circuit where there are n number of inputs, and "0" and "1" are input to the other inputs respectively, $2^{n-1}$ times of simulation are required to obtain all the activation patterns of the transistor circuit.

Depending on the characteristics of the circuit, the setting of "Z" and "inverted value of the activation signal" may also be required in addition to "0" and "1", to activate the activation path. In this case, the radix of the number of times of simulation increases from 2 to 4, and the number of times of simulation becomes $4^{n-1}$ and, out of the simulation results, a critical path having a maximum or minimum delay must be selected. It is not practical to apply the activation path simulation method requiring such an enormous number of times of simulation to such a transistor circuit as a large-scale integrated circuit (LSI). The problem is the length of processing time required for an enormous number of times of simulation.

On the other hand, such a method as PODEM is known as a method to decrease the number of times of simulation without executing unnecessary simulation, minimizing the activation patterns which do not influence activation, as much as possible, so as to decrease processing time. However, conventional methods target gate level, where decreasing activation patterns is limited, and a further decrease of processing time is desired considering the scale of the current highly dense transistor circuit.

SUMMARY OF THE INVENTION

With the foregoing in view, it is an object of the present invention to provide an activation path simulation equipment and an activation path simulation method which can efficiently determine activation patterns and can further decrease the number of times of simulation.

To achieve the above object, an activation path simulation equipment and an activation path simulation method in accordance with the present invention divides a transistor circuit into a plurality of blocks with reference to the pn junction nodes of the transistors included therein, and the activation patterns are determined for each block using the characteristics of each transistor so as to efficiently create activation patterns of the transistor circuit. In this way, the number of activation patterns to be created can be decreased without creating unnecessary activation patterns, therefore the number of times of simulation can be decreased, which means that simulation speed increases.

To achieve the above object, the activation path simulation equipment of the present invention comprises, for example, a division unit for dividing a transistor circuit into a plurality of blocks with reference to the pn junction nodes in the plurality of transistors constituting the transistor circuit, a creation unit for creating the activation patterns of at least one block on the activation path according to the characteristics of transistors included in the block, and a simulation unit for executing simulation of the activation path according to the created activation patterns.

More specifically, the division unit divides the transistor circuit into blocks according to the power supply node, ground node, and input and output of the transistor circuit, in addition to the above mentioned pn junction nodes. In this way, the transistor circuit is divided into blocks which are the minimum units of activation, and activation patterns at transistor level can be created.

The creation unit creates activation patterns not by using the input of the transistor circuit which does not influence the activation of at least one block on the activation path, but by using the above input which influences thereon. In this way, the creation unit does not consider inputs, which do not influence activation, so that the number of activation patterns decreases and the number of times of simulation decreases.

BRIEF DESCRIPTION OF THE DRAWINGS

FIGS. 1A and 1B are drawings depicting a p-type transistor;

FIGS. 2A and 2B are drawings depicting an n-type transistor;

FIG. 5 is a processing flow chart depicting the activation path simulation method in accordance with the embodiment of the present invention;

FIGS. 12A, 12B, 12C and 12D are drawings depicting the case of determining the activation patterns of a 2-input NAND circuit;

FIG. 14 is a drawing depicting all branch searching in a simulation; and

FIGS. 15A and 15B are drawings depicting an example of a logical value table, which is a simulation rule.

DESCRIPTION OF THE PREFERRED EMBODIMENTS

An embodiment of the present invention will now be described. The technical scope of the present invention, however, is not restricted by this embodiment.

At first, a p-type transistor, n-type transistor and path transistor, constituting a transistor circuit to which the activation path simulation equipment and activation path simulation method in accordance with the present embodiment are applied, will be explained.

FIGS. 1A and 1B are drawings depicting a p-type transistor. In FIG. 1A, the p-type transistor controls the signal of the source node (S) by the signal of the gate node (G), and outputs the signal to the drain node (D). When "0" is input to the gate node (G), the source (S) and drain (D) conduct, and when "1" is input to the gate node (G), the source (S) and drain (D) are disconnected. FIG. 1B is a definition table of the operation rule of the p-type transistor.

In the definition table, "X" indicates an undefined value (arbitrary value), "W1" indicates a weak 1, "W0" indicates a weak 0, and "Z" indicates a disconnection value.

FIGS. 2A and 2B are drawings depicting an n-type transistor. In FIG. 2A, just like the p-type transistor, the n-type transistor controls the signal of the source node (S) by the signal of the gate node (G), and outputs the signal to the drain node (D). When "1" is input to the gate node (G), the source (S) and drain (D) conduct, and when "0" is input to the gate node (G), the source (S) and drain (D) are disconnected. FIG. 2B is a definition table of the operation rule of the n-type transistor. The definition of symbols is the same as in FIG.. 1B.

Figure 3A:
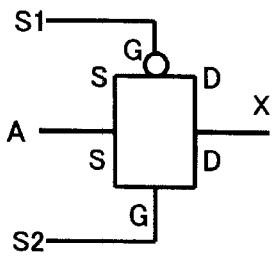
FIGS. 3A and 3B are drawings depicting a path transistor.
Figure 3B:
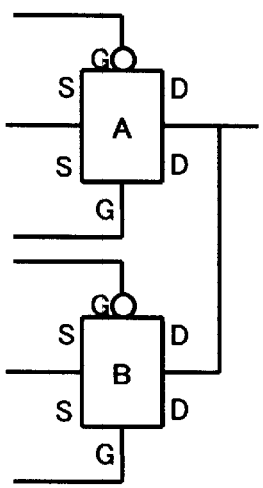

FIGS. 3A and 3B are drawings depicting a path transistor. In FIG. 3A, the path transistor has a structure where the p-type transistor and n-type transistor are combined so as to share the source node (S) and the drain node (D). When the input S1 is "0" and the input S2 is "1", both the p-type transistor and n-type transistor are in conduct status, so the input A is output to the output X. This status is referred to as "path transistor is open".

When the input S1 is "1" and input S2 is "0", on the other hand, both the p-type transistor and n-type transistor are in disconnect status, so the input A is not output to the output X, and "z" is always output to the output X. This status is referred to as "path transistor is closed". The combination of "0" for both the input S1 and input S2 and a combination of "1" for both the input S1 and input S2 are prohibited.

In a circuit where the path transistors which share output are combined, as shown in FIG. 3B, the simultaneous opening of the plurality of transistors is prohibited. For example, if the path transistor A is open in FIG. 3B, the path transistor B must be closed. When both the path transistors A and B are open, it is regarded that signal "Z" is input to one of the source nodes.

Now an activation path simulation equipment and activation path simulation method in accordance with the embodiment of the present invention for executing activation path simulation for a circuit comprised of the above mentioned transistors will be described.

Figure 4:
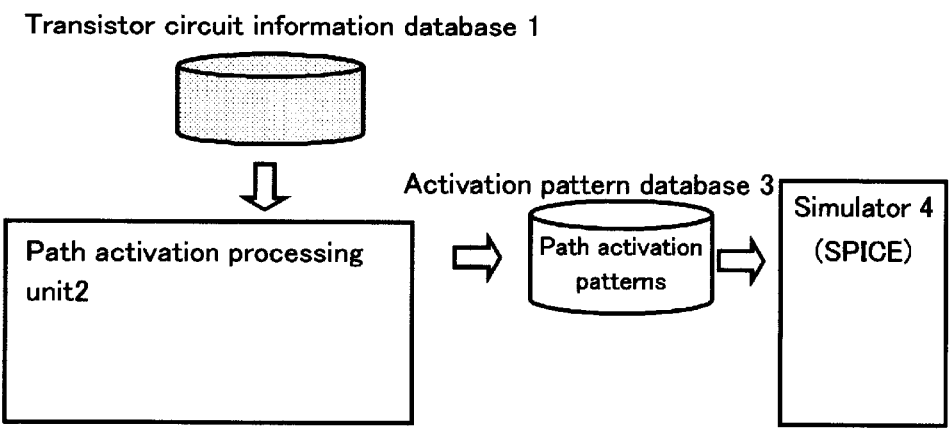
FIG. 4 is a block diagram of the activation path simulation equipment 10 in accordance with the embodiment of the present invention.

FIG. 4 is a block diagram of the activation path simulation equipment 10 in accordance with the embodiment of the present invention. The transistor circuit information data base 1 is a transistor circuit information data base for storing characteristics information on each transistor constituting the transistor circuit. The path activation processing unit 2 creates activation patterns by the activation pattern creation method according to the present invention, which will be described later. The created activation patterns are stored in the activation pattern data base 3. The simulator 4 executes simulation for the activation patterns. Specifically, the path simulation equipment 10 is implemented by a computer system. In other words, the path activation processing unit 2 executes an activation pattern creation program, and the simulator 4 executes a predetermined simulation program.

FIG. 5 is a processing flow chart depicting the activation path simulation method in accordance with the embodiment of the present invention. Each step in FIG. 5 will be described next. Step 1 to Step S3 are executed by the path activation processing unit 2 in FIG. 4, and Step S4 is executed by the simulator 4 in FIG. 4.

Block Division of Transistor Circuit (S1)

At first, the transistor circuit is divided into transistor level blocks. In other words, the transistor circuit is divided with reference to pn junction nodes. A pn junction node is a node where the drain nodes (D) of the p-type transistor and n-type transistor are joined. By dividing the transistor circuit with reference to the pn-junction nodes, the transistor circuit is divided by a minimum number of units where logic is established. More specifically, each block is divided according to the power supply node (VDD), ground node (VSS), and IO (input/output) nodes, in addition to pn junction nodes of the transistor.

Figure 6A:
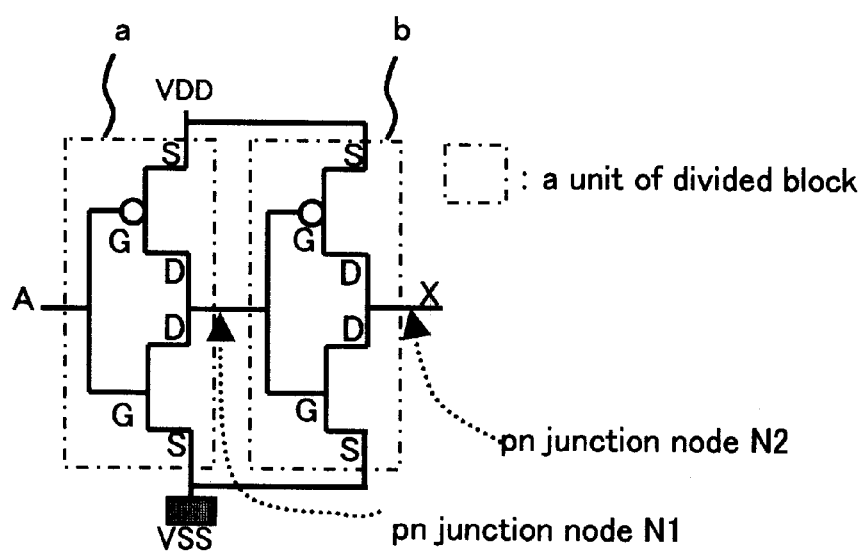
FIGS. 6A and 6B are drawings depicting a block division of a transistor circuit.
Figure 6B:
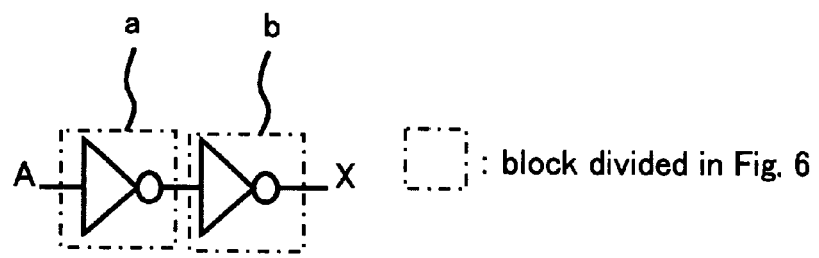

FIGS. 6A and 6B are drawings depicting the block division of a transistor circuit. FIG. 6A, the block a is divided by the input A, VDD, VSS and the pn junction node N1, the block b is separated by the pn junction node N1, VDD, VSS and the output X (pn junction node N2). In this way, a transistor circuit is first divided with reference to the pn junction nodes. FIG. 6B is an equivalent circuit of the circuit shown in FIG. 6A.

Grouping Block Outputs and Circuit Inputs (S2)

Then the block outputs of the activation path and circuit inputs, which influence the change of outputs, are grouped by the algorithm which is explained below.

Figure 7:
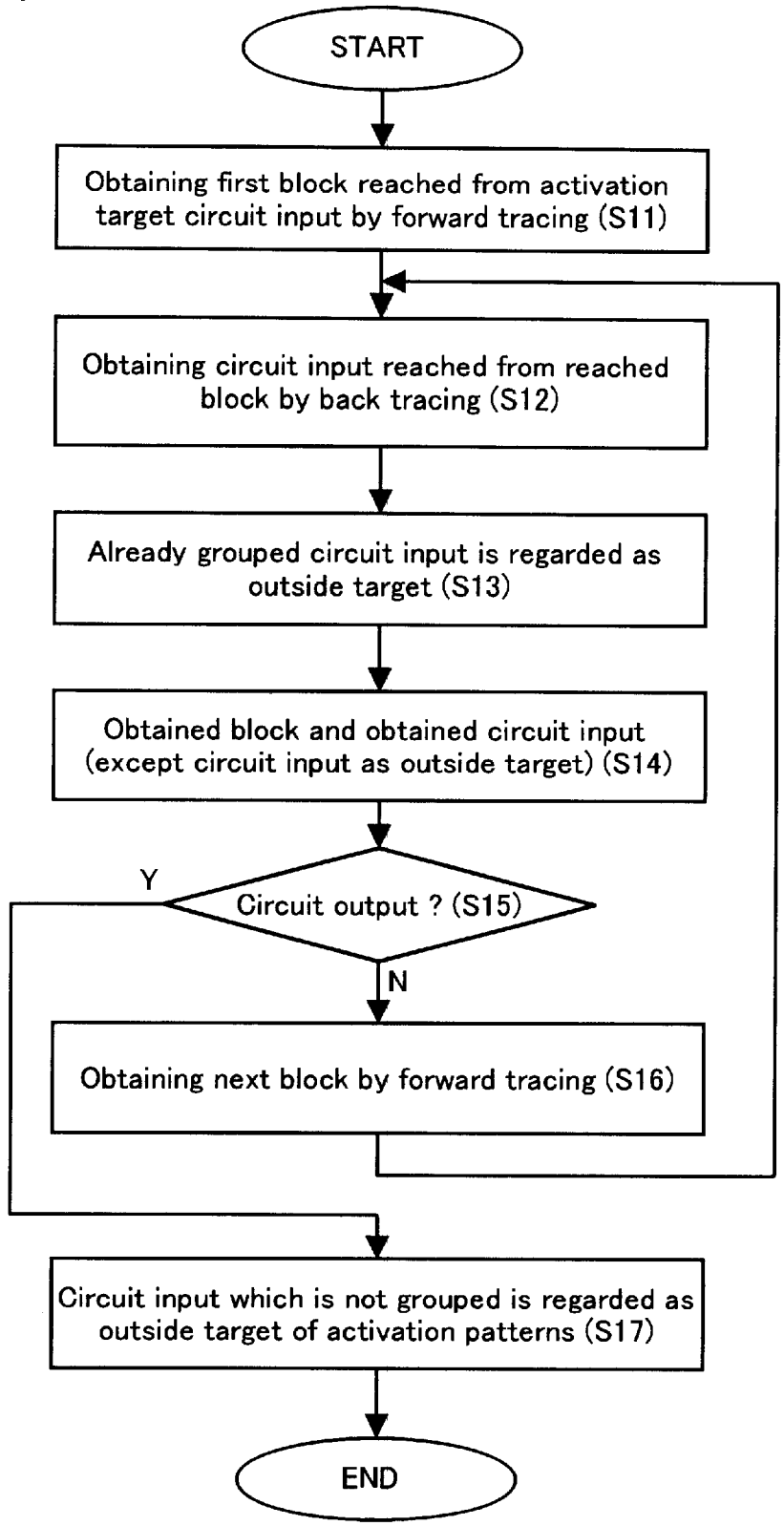
FIG. 7 is a flow chart depicting a grouping algorithm.
Figures 8, 9:
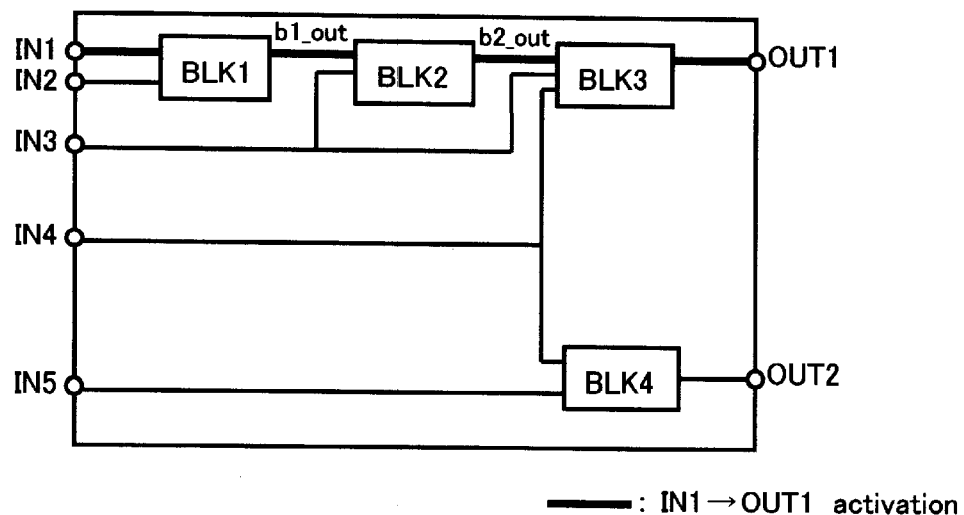
FIG. 8 is a diagram depicting a circuit divided into blocks.
FIG. 9 is an example of a table of a grouped block output and circuit input.

FIG. 7 is a flow chart depicting the grouping algorithm. FIG. 8 is a diagram depicting a circuit divided into blocks. FIG. 7 will now be described with reference to FIG. 8. In Step S11, forward tracing, from the activation target circuit input to the first block, is executed. When the activation path is IN1→OUT1 in FIG. 8, forward tracing, from the activation target circuit input IN1, reaches the block BLK1.

In the Step S12 in FIG. 7, back tracing is executed from the block reached in Step S11, so as to obtain the circuit input to be reached. If back tracing is executed from the block BLK1 in FIG. 8, the circuit inputs IN1 and IN2 are obtained. Out of the obtained circuit inputs, an already grouped circuit input is regarded as outside the target in Step S13 in FIG. 7. The circuit inputs IN1 and IN2 in FIG. 8 are not grouped circuit inputs, so they are within the target.

In the Step S14 in FIG. 7, the output of the block reached by forward tracing and the circuit inputs, which were obtained by back tracing but not excluded in the Step S13, are grouped. In other words, the output b1_out of the block 1 and the circuit inputs IN1 and IN2 are grouped in FIG. 8.

If the output of the block reached by forward tracing is the circuit output in the Step S15 in FIG. 7, processing advances to the later mentioned Step S17, and if it is block output other than circuit output, processing advances to the next Step, S16. In the Step S16, forward tracing is continuously executed until the next block. The next block is Block BLK2 in FIG. 8.

Then processing from the Steps 12 to the Steps 15 is repeated. In other words, the circuit inputs IN1, IN2 and IN3 in FIG. 8 are obtained by back tracing in the Step S12. The circuit inputs IN1 and IN2, however, are already grouped with the output b1_out of the block BLK1, so the circuit inputs IN1 and IN2 are regarded as outside the target in the Step S13. And in the Step S14, the output b2_out of the block BLK2 and the circuit input IN3 are grouped. In the same way, the output OUT1 of the block BLK3 is grouped with the circuit input IN4. At this time, the output OUT1 of the block BLK3 is the circuit output. Therefore, if there is a circuit input which is not grouped in the Step S17, the circuit input is regarded as outside the target of the activation patterns for the activation path IN1→OUT1.

In FIG. 8, the circuit input IN5 is outside the target. In other words, the circuit input IN5 is reached by back tracing from any of the blocks (BLK1, BLK2, BLK3) on the activation path (IN1→OUT1), therefore a change of the circuit input IN5 does not influence the activation path at all. As a result, an arbitrary value of "0" and "1" is input to the circuit input IN5.

FIG. 9 is an example of a table of grouped block output and circuit input. FIG. 9 is a table obtained for the activation path IN1→OUT1 in FIG. 8 by applying the algorithm in FIG. 7. In other words, the block output b1_out and circuit inputs IN1 and IN2 are grouped, the block output b2_out and the circuit input IN3 are grouped, and the circuit output OUT1 and the circuit input IN4 are grouped. Activation patterns are obtained after the block outputs and circuit inputs are grouped in this way.

Activation pattern creation (S3)

In the embodiment of the present invention, activation patterns are obtained by fixing (unitarily determining) a signal set for inputs using the characteristics of transistor circuits in the block. In this way, activation patterns are limited and the number of times of simulation can be decreased.

Figure 10A:
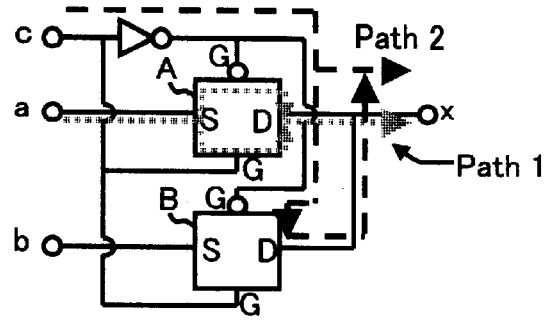
FIGS. 10A, 10B and 10C are drawings depicting the setting of signals of a path transistor circuit.
Figure 10B:
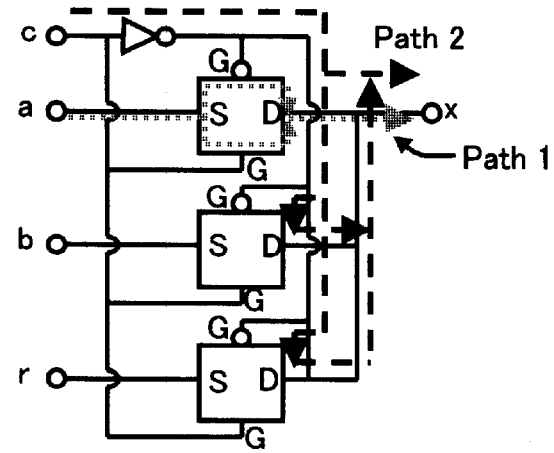
Figure 10C:
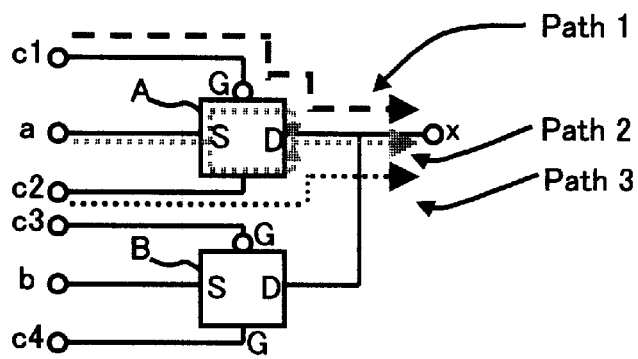

FIGS. 10A, 10B and 10C are drawings depicting the setting signal for a path transistor. Each transistor circuit to be explained, shown in FIGS. 10A, 10B, 10C and 11, is a transistor circuit in one block.

In FIGS. 10A and 10B, the case when "Z" is set for an input will be explained. FIGS. 10A and 10B show selectors having a plurality of path transistors which are simultaneously opened. When a block is comprised of such a transistor circuit, a value other than "Z" (that is, "0" or "1") is input to one of the source nodes (S) of the path transistors to be opened, and the other source nodes are fixed to "Z" to prevent contention at the output x.

If the activation path is the path 1 (input a→output x) in FIG. 10A, for example, the activation signal α is input to the input a which is connected to the source node (S) of the path transistor A. The activation signal a is a signal which changes from "0" to "1" (hereafter called the Up signal), or a signal which changes from "1" to "0" (hereafter called the Down signal).

Therefore "Z" is input to the input b which is connected to the source node (S) of the other path transistor B. Since the signal to be input to the input b is unitarily determined (fixed), the number of times of simulation can be decreased. If the input b→output x is the activation path, the activation signal α is input to the input b, so the input a is fixed to "z". If the path 2 (input c→output x) is the activation path, a value other than "Z" is input to one of the inputs a and b, and "Z" is input to the other.

Assume that the path 1 (input a→output x) is the activation path in FIG. 10B, for example. In this case as well, the activation signal α is input to the input a, just like the above mentioned case, so "Z" is input to the other inputs b and r, which are connected to the other source node (S). In other words, the values input to the inputs b and r are fixed to "Z", which means that in this case the number of simulations is also decreased. The case when the input b→output x or input r→output x is the activation path is also the same as above, where the activation signal α is input to the activation target input, "Z" is input to the other inputs. The case when the path 2 (input c→output x) is the activation path is also the same as above, where a value other than "Z" is input to one of the inputs a, b or r, "Z" is input to the other inputs.

Now the case when an inverted value of the activation signal and the close signal and open signal of the path transistor are set will be explained with reference to FIG.. 10C.

If the activation path is the path 1 (input c1→output x) in the path transistor A where the gate node is not shared, "the inverted value of the activation signal" is set for the input c2. If the Up signal of the activation signal α is input to the input c1, the Down signal is input to the input c2. If the Down signal is input to the input c1, on the other hand, the Up signal is input to the input c2. In this way, if the gate node (G) of the path transistor is the activation target, then the signal to be set for the gate node (G) of the paired transistor is fixed to "the inverted value of the activation signal". For the path transistor B as well, the Down (Up) signal is input to the input c4 if the Up (Down) signal is input to the input c3.

When the activation path is one of path 1 (input c1→output x), path 2 (input α→output x), or path 3 (input c2→output x), the path transistor B must be closed so that contention does not occur at the output x. Therefore the input c3 is fixed to "1" and the input c4 is fixed to "0". In this way, if one block is a selector comprised of a plurality of path transistors sharing output, values for inputs in the path transistors, other than the path transistor which includes the activation path, are set so that the path transistors other than the path transistor which includes the activation path are closed. At this time, the source node (S) of the path transistor to be closed can be an arbitrary value "X". For example, when the path transistor B is closed, an arbitrary value "X" is set for the input b. This is because the signal from the input b is not transferred to the drain node (D), since the path transistor B is closed.

When the activation path is the path 2 (input c2→output x), the path transistor A must be open. Therefore the input c1 is fixed to "0" and the input c2 is fixed to "1". In this way, if the source node (S) of the path transistor is the activation target, a value of the input to be connected to the gate node (G) of the path transistor is set such that the path transistor opens.

Figure 11:
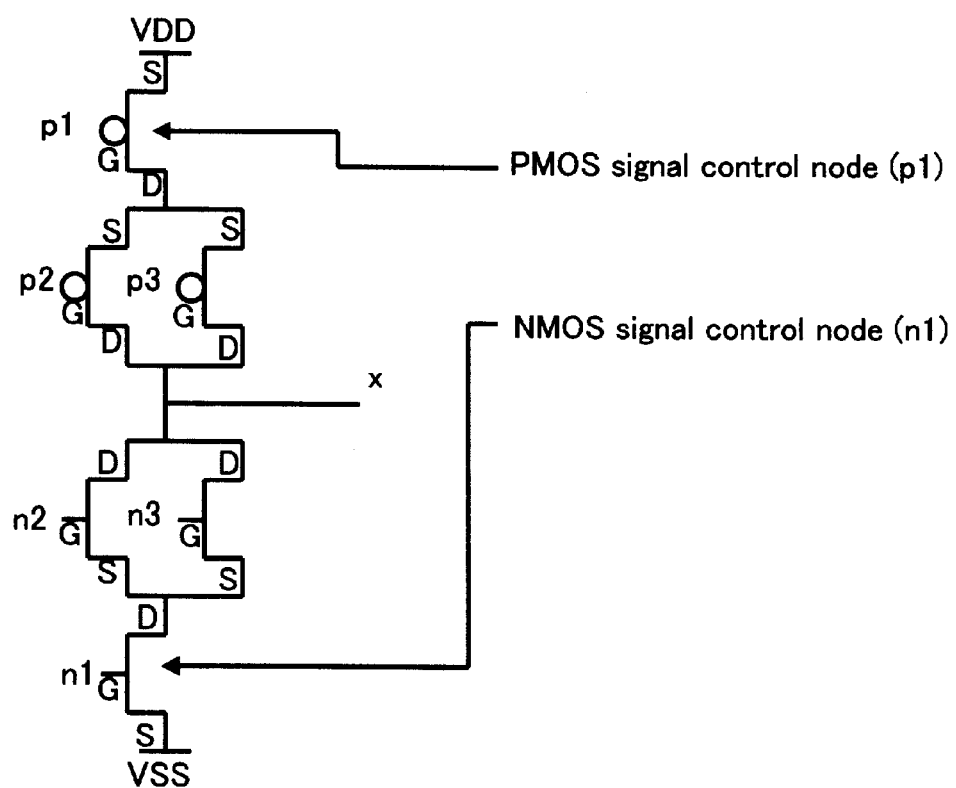
FIG. 11 is a drawing depicting the setting of signals for a static circuit.

FIG. 11 is a drawing depicting the setting of signals for a static circuit. In a circuit comprised of a p-type transistor and n-type transistor, as shown in FIG. 11, a gate node (p1) of the transistor, which is always passed through during back tracing from the output x to the power supply node (VDD), is called the signal control node of the p-type transistor. A gate node (n1) of the transistor, which is always passed through during back tracing from the output x to the ground node (VSS), is called the signal control node of the n-type transistor.

When an activation signal α is required for the output x, the signal control node p1 is fixed to "0" and the signal control node n1 is fixed to "1". This is because both the signal control nodes p1 and n2 must be open to output both "0" and "1" values to the output x, since the activation signal α, that is, the Up signal from "0" to "1" or the Down signal from "1" to "0", is required for the output x.

When "0" is required for the output x, the signal control node n1 is fixed to "0". When "1" is required for the output x, on the other hand, the signal control node is fixed to "1". The case when the signal nodes p1 and n1 are on the activation path, however, is the exception. In this case, the activation signal α is input to the signal control nodes p1 and n1 on the activation path.

FIGS. 12A, 12B, 12C and 12D are drawings depicting the case of determining the activation patterns of a 2-input NAND circuit. FIG. 12A is a logic diagram of the 2-input NAND circuit, and FIG. 12B is the transistor equivalent circuit diagram thereof. It is assumed that the input IN1→output OUT is specified as the activation path in the NAND circuit having inputs IN1, IN2 and output OUT, as shown in FIG. 12A.

If the above mentioned signal setting method shown in FIG. 11 is applied in FIG. 12B, then the gate node (G) of the transistor at the VSS side, out of the two transistors which are always passed through during back tracing from the output OUT to the ground node VSS, is connected to the input IN2. Therefore the input IN2 is a signal control node for the n-type transistor, and in order to output the activation signal α to the output OUT, the input IN2 must be "1" according to the above mentioned signal setting method. The gate node of the other transistor is connected to the input IN1, and the input IN1 is on the activation path, so the activation signal a is input there. There is no transistor which is always passed through during back tracing from the output OUT to the power supply node (VDD).

Therefore when the input IN1→output OUT is specified to the activation path, the input IN2, which is not on the activation path, is unitarily set to "1". In other words, the input IN1 →output OUT path is activated only when "1" is set for the input IN2. This result matches with the activation pattern determined from the logic table of the 2-input NAND circuit, which will be described next.

FIG. 12C is a logic pattern of the 2-input NAND circuit. In other words, output values from the output OUT corresponding to the input values ("0" or "1") from the input IN1 and IN2 are expressed. When an activation signal is input to the input IN1 in th e activation path IN1→OUT, a value of the output OUT changes (is activated) only when "1" is input to the input IN2, and the value of the output OUT does not change (is not activated) when "0" is input to the input IN2, as shown in FIG. 12C.

In this way, the activation pattern in the path IN1→OUT is determined as the pattern table shown in FIG. 12D.

In some cases, to activate an activation path in a block, the signal set for an input, which is not on the activation path, can be fixed based on the characteristics of the transistor. In such a case, it is unnecessary to simulate combination patterns of all the values for a plurality of inputs, so the number of times of simulation can be decreased. Also, unlike the case of obtaining activation patterns at gate level, activation patterns are obtained at the transistor level in the present embodiment of the invention, therefore the number of activation patterns to be simulated can be decreased even more.

Figures 13A, 13B:
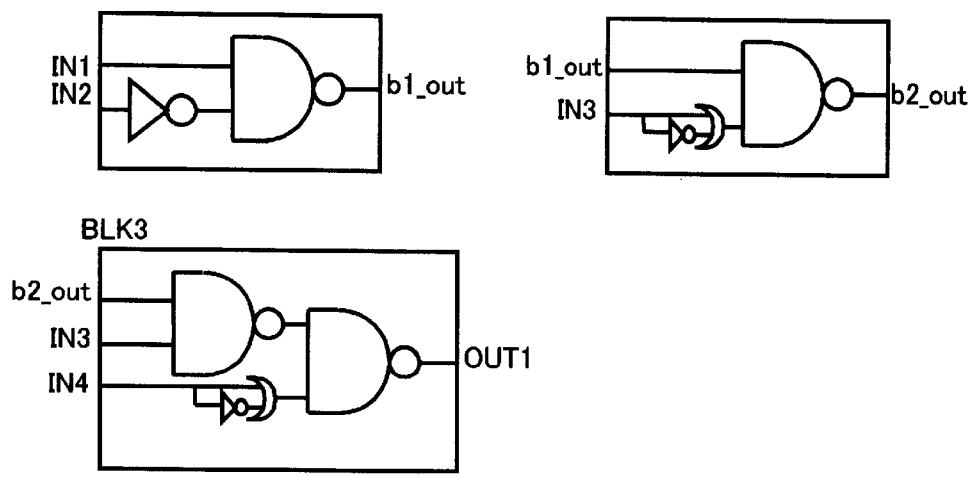
FIGS. 13A and 13B are drawings depicting an example of the activation patterns of blocks BLK1, BLK2 and BLK3 in FIG. 8.

FIGS. 13A and 13B are drawings depicting an example of activation patterns of the blocks BLK1, BLK2 and BLK3 in FIG. 8. It is assumed that the blocks BLK1, BLK2 and BLK3 have t he logic structures shown in FIG. 13A. FIG. 13B shows activation patterns in such a case. As shown in FIG. 13B, when the activation signal α is input to the input IN1 on the activation path in the block BLK1, the block output b1_out changes only when "0" is input to the input IN2, which is not on the activation path. In other words, the activation signal α is output. The block output b1_out becomes the input of the block BLK2. In the block BLK2, the block output b2_out changes, whether "0" or "1" is input to the input IN3, which is not on the activation path. And the block output b2_out becomes the input of the block BLK3. In the block BLK3, the output OUT1 changes only when "1" is input to the input IN3 out of the inputs IN3 and IN4, which are not on the activation path. At this time, any value of "0" and "1" may be input to the input IN4.

Branch Deletion and Simulation Execution (S4)

Simulation for the obtained activation patterns is executed next. According to the embodiment of the present invention, simulation is executed based on an all branch search method for the above mentioned grouped circuit inputs.

FIG. 14 is a drawing depicting an all branch search in simulation. FIG. 14 shows all the branches of the activation simulation for the activation path IN1→OUT1 in the circuit shown in FIG. 8, and for example, the branches are deleted based on the activation patterns shown in FIG. 13B.

More specifically, in FIG. 14, the activation signal a is input to the input IN1. And eight kinds of branches are determined depending on the combination with "0" and "1" to be input to the other inputs IN2, IN3 and IN4. This means that in a normal simulation, eight times of simulation is necessary to execute activation simulation for the activation path IN1→OUT1.

According to the embodiment of the present invention, on the other hand, branches are deleted as follows by using the activation patterns in FIG. 13B, and the number of times of simulation can be decreased. In other words, the branches where (IN1, IN2) is (α, 1) (the portion of dotted line P1 in FIG. 14) are deleted, since these are not the activation patterns of the block BLK1 according to the activation patterns in FIG. 13B. Also the branches where (IN1, IN2, IN3) is (α, 0, 0) (the portion of dotted line P2 in FIG. 14) are deleted, since these are not the activation patterns of the block BLK3 according to the activation patterns in FIG. 13B. As a result, the remaining branches are two branches where (IN1, IN2, IN3) is (α, 0, 1), that is, the number of times of simulation is two, and the number of times of simulation can be considerably decreased.

And in simulation, a logic simulation rule based on six values, "1", "0", "Z", "X (undefined value)", W1 (weak 1)", and "W0 (weak 0)", is applied. And the activation signal α is simultaneously processed for each node having both "0" and "1". That is, the Up signal (rise) of the activation signal α is processed as "0/1", and the Down signal (fall) is processed as "1/0". In this way, simple activation simulation with six values can be executed.

FIGS. 15A and 15B are drawings depicting an example of a logic value table, which is a simulation rule. The logic value table defines the selection rule at each node of the p-type transistor,n-type transistor and path transistor. For example, FIG. 15A is a logic value table of pn junction nodes (excluding dot nodes of the path transistor), and FIG. 15B is a logic value table of the dot nodes of the path transistor. The logic value tables in FIGS. 15A and 15B are an example of this, and simulation for all the activation patterns become possible by defining the logic value tables corresponding to all the junction formats of the p-type transistors, n-type transistors and path transistors of the transistor circuit.

As mentioned above, according to the embodiment of the present invention, a transistor circuit is divided into a plurality of blocks primarily for each pn junction node, a block and inputs are grouped, activation patterns are obtained in a block unit, and branches of simulation are deleted based on the activation patterns so as to decrease the number of times of simulation.

Specifically, when k1 number of inputs do not become the target of grouping in grouping processing (Step S2 in FIG. 5) in a transistor circuit having n number of inputs, $2^{n-1}-2^{n-1-k1}$ times of simulation can be decreased compared with the case when all patterns of the transistor circuit are simulated (number of times of simulation is $2^{n-1}$).

When the number of inputs for which a fixed value is set is k2, and the number of inputs for which an arbitrary value ("X") is set is k3 in the activation pattern creation processing (Step S3 in FIG. 5) for a block having m number of inputs, $2^{m-1}-2^{m-1-k2-k3}$ times of simulation can be decreased compared with the case when all patterns of the block is simulated (number of times of simulation is $2^{m-1}$).

Also, even if "Z" or an "inverted value of the activation signal" is required for an input to activate the path, "Z" or the "inverted value of the activation signal" is set as a fixed value by the above mentioned activation pattern creation processing, so the radix of the number of times of simulation can be decreased from "4" to "2", and as a result, the number of times of simulation can be decreased.

The following mode is also possible for the activation path simulation equipment of the present invention.

When a block has a plurality of path transistors which are simultaneously opened, the creation unit (path activation processing unit 2) sets a disconnection value "Z" for the source nodes of a path transistor which is not on the activation path.

When a block has a path transistor which gate nodes are not shared, and an activation signal is set for one gate node of the path transistor, the creation unit sets an inverted value of the activation signal for the other gate node.

When a block has a plurality of path transistors, which gate nodes are not shared respectively, the creation unit sets an open signal for a pair of gate nodes of a path transistor on the activation path so as to open the path transistor.

When a block has a plurality of path transistors which gate nodes are not shared respectively, the creation unit sets a close signal for a pair of gate nodes of a path transistor which is not on the activation path so as to close the path transistor. In this case, the creation unit sets an arbitrary value "X" for the source node of the path transistor to be closed.

When a block has a p-type transistor and an n-type transistor, the signal control node of the p-type transistor and the signal control node of the n-type transistor are not on the activation path and the block output is on the activation path, the creation unit sets "0" for the signal control node of the p-type transistor and sets "1" for the signal control node of the n-type transistor.

The following embodiment is also possible for the activation path simulation method of the present invention.

A block is divided according to the power supply node, ground node, input and output of the transistor circuit, in addition to a pn junction node. An activation pattern is created not by using the input of the transistor circuit which does not influence the activation of at least one block on the activation path, but by using the above input which influences thereon.

According to the present invention, a transistor circuit is divided into a plurality of blocks with reference to the pn-junction nodes of the transistors included in the transistor circuit, and the activation patterns of each block are determined using the characteristics of each transistor, so that the activation patterns of the transistor circuit can be efficiently created. In this way, unnecessary activation patterns are not created and the number of activation patterns to be created can be decreased, therefore the number of times of simulation can be decreased. In other words, the simulation speed increases.

The protective scope of the present invention is not limited by the above embodiment, but comes within the invention stated in the claims and their equivalents.

What is claimed is:

1. An activation path simulation equipment for executing delay analysis of an activation path in a transistor circuit by simulation comprising:
   a division unit for dividing the transistor circuit into a plurality of blocks with reference to pn junction nodes in the plurality of transistors constituting the transistor circuit;
   a creation unit for creating activation patterns of at least one block on the activation path according to the characteristics of transistors included in the block; and
   a simulation unit for executing simulation of the activation path according to the created activation patterns.

2. The activation path simulation equipment according to claim 1, wherein the division unit divides the transistor circuit into blocks according to power supply node, ground node, and input and output of the transistor circuit, in addition to the pn junction nodes.

3. The activation path simulation equipment according to claim 1, wherein the creation unit creates the activation patterns by using input of the transistor circuit which influences the activation of at least one block on the activation path, not by using input which does not influence thereon.

4. The activation path simulation equipment according to claim 1, wherein in case that the block has a plurality of path transistors which are simultaneously opened, the creation unit sets a disconnection value "Z" for the source nodes of a path transistor which is not on the activation path.

5. The activation path simulation equipment according to claim 1, wherein in case that the block has a path transistor which gate nodes are not shared, and an activation signal is set for one gate node of the path transistor, the creation unit sets an inverted value of the activation signal for the other gate node.

6. The activation path simulation equipment according to claim 1, wherein in case that the block has a plurality of path transistors, which gate nodes are not shared respectively, the creation unit sets an open signal for a pair of gate nodes of a path transistor on the activation path so as to open the path transistor.

7. The activation path simulation equipment according to claim 1, wherein in case that the block has a plurality of path transistors which gate nodes are not shared respectively, the creation unit sets a close signal for a pair of gate nodes of a path transistor which is not on the activation path so as to close the path transistor.

8. The activation path simulation equipment according to claim 7, wherein the creation unit sets an arbitrary value "X" for the source node of the path transistor to be closed.

9. The activation path simulation equipment according to claim 1, wherein in case that the block has a p-type transistor and an n-type transistor, the signal control node of the p-type transistor and the signal control node of the n-type transistor are not on the activation path and the block output is on the activation path, the creation unit sets "0" for the signal control node of the p-type transistor and sets "1" for the signal control node of the n-type transistor.

10. An activation path simulation method for executing delay analysis of an activation path in a transistor circuit by simulation comprising the steps of:

dividing the transistor circuit into a plurality of blocks with reference to pn junction nodes in the plurality of transistors constituting the transistor circuit;

creating activation patterns of at least one block on the activation path according to the characteristics of transistors included in the block; and executing simulation of the activation path according to the created activation patterns.

11. A method for creating activation patterns for delay analysis of an activation path in a transistor circuit comprising the steps of:

dividing the transistor circuit into a plurality of blocks with reference to pn junction nodes in the plurality of transistors constituting the transistor circuit; and creating activation patterns of at least one block on the activation path according to the characteristics of transistors included in the block.

12. The method according to claim 11, wherein, in the step of dividing, the transistor circuit is divided into blocks according to power supply node, ground node, and input and output of the transistor circuit, in addition to the pn junction nodes.

13. The method according to claim 11, wherein in the step of creating, the activation patterns are created by using input of the transistor circuit which influences the activation of at least one block on the activation path, not by using input which does not influence thereon.

14. A recording medium storing a computer program for creating activation patterns for delay analysis of an activation path in a transistor circuit, the computer program comprising the steps of:

dividing the transistor circuit into a plurality of blocks with reference to pn junction nodes in the plurality of transistors constituting the transistor circuit; and creating activation patterns of at least one block on the activation path according to the characteristics of transistors included in the block.

15. An activation path simulation equipment for executing delay analysis of an activation path in a transistor circuit by simulation comprising:

a division unit for dividing the transistor circuit into a plurality of blocks with reference to pn junction nodes in the plurality of transistors constituting the transistor circuit;

a creation unit for creating activation patterns of at least one block on the activation path according to the characteristics of transistors included in the block; and a simulation unit for executing simulation of the activation path according to the created activation patterns;

wherein in case that the block has a path transistor which gate nodes are not shared, and an activation signal is set for one gate node of the path transistor, the creation unit sets an inverted value of the activation signal for the other gate node.

* * * * *